United States Patent Office 3,525,615 Patented Aug. 25, 1970

3,525,615
PHOTOPOLYMERIZATION PROCESSES AND ELEMENTS THEREFOR

Vaughan C. Chambers, Jr., Fair Haven, N.J., assignor to E. I. du Pont de Nemours and Company, Wilmington, Del., a corporation of Delaware No Drawing. Filed July 7, 1966, Ser. No. 563,367
Int. Cl. G03c *11/12*
U.S. Cl. 96—28 15 Claims

ABSTRACT OF THE DISCLOSURE

Image-forming elements comprising a support and a photopolymerizable stratum comprising (a) an inorganic thixothropic gel binder, as the sole binder, (b) an ethylenically unsaturated compound, (c) a free-radical generating, addition polymerization initiator activatable by actinic light and thermally inactive at and below 85° C. and (d) a thermal polymerization inhibitor; and image-forming processes of (1) exposing the elements imagewise, (2) bringing the exposed stratum into contact with a receptive support, (3) applying high pressure to the assembled elements to liquefy and transfer unexposed areas to the support and (4) separating the elements. The elements and processes are useful for transferring images to paper, metal, silk screens, etc. from photographic positives, negatives and halftones.

This invention relates to processes of image reproduction involving imagewise photopolymerization and transfer techniques and novel elements therefor.

Copying techniques embodying thermal transfer are known. Thermal transfer processes can be accomplished in a wet system or where water-yielding materials are present in addition to light-sensitive materials. Dry processes for forming images by photopolymerization techniques and thermal transfer are also known. These processes are often limited by one or more of the following disadvantages:

(1) They require conditions in which image transfer is sensitive to thermal control, (2) They require long exposure times or high intensity radiation sources, (3) They require wet operating conditions, and (4) They do not provide uniform density of transferred images as is required in color proofing.

Thixotropic gels possess a structure which is oriented and in kinetic equilibrium while undisturbed. As stress is applied to the thixotropic composition, the viscosity decreases and the structure becomes disoriented. As stress decreases, the viscosity increases and orientation of the structure again takes place. The term "thixotropic binder" as used in this invention refers to those thixotropic materials which can be coated into layers, have structures that become disoriented with an accompanying decrease in viscosity upon the application of shear stress or pressure, and return to higher viscosity and oriented structure upon removal of shear stress or pressure. The terms "high shear" and "high pressure" as used herein means a pressure, when exerted in shear, or applied directly, at room temperature, causes the thixotropic binder in the underexposed areas to liquefy and adhere to a receptor surface, and remain as adherent areas of at least detectable thickness upon separation of the receptor element from the element containing the original stratum embodying said binder. The term "underexposed" as used herein is intended to cover the image areas which are completely unexposed or those exposed only to the extent that there is additional polymerizable compound still present in sufficient quantity so that the application of high shear or high pressure to the stratum will cause a liquefaction in the underexposed area and not in the exposed area.

The novel image-yielding elements of this invention in its broader aspects comprise a support, usually a flexible sheet, having coated thereon a photopolymerizable stratum said photopolymerizable stratum comprising a uniform admixture of (a) An inorganic thixotropic gel binder (b) A nongaseous ethylenically unsaturated compound containing at least one terminal ethylenic group and being capable of forming a high polymer by free radical initiated chain propagating, addition polymerization.

Constituents (a) and (b) being present in from 0.2 to 12 parts by weight and 1 to 30 parts by weight, respectively.

Generally, the photopolymerizable composition is coated from a dispersion in 38 to 90 parts by weight of water, alcohol, or mixtures thereof. (The photopolymerizable coating composition preferably contains 4 to 5 parts by weight of constituent (a) and from 1.4 to 1.9 parts by weight of constituent (b). Preferably, the photopolymerizable compositions also contain a free radical generating addition polymerization initiator in amounts ranging from 0.05 to 2 parts by weight. A pigment and pigment dispersant may be added and are generally present in 0.4 to 25 and 0.05 to 2 parts by weight, respectively. Also, small amounts of thermoplastic organic polymers as described in Plambeck 2,760,863 may be present as diluents in amounts up to 5% of the thixotropic binder.

To prepare the photopolymerizable composition, the various ingredients including the thixotropic binder and the ethylenically unsaturated monomer are milled, for example, in a ball mill for a period of time, usually 24 hours, to produce average particle sizes of the solids of 5 to 500 millimicrons, and then coated on a suitable support. The dispersion medium is dried by evaporation at room temperature. The photopolymerizable composition having an image-yielding stratum of the above components is preferably laminated to a physically removable cover sheet capable of uniformly transmitting actinic radiation and having low permeability to oxygen by contacting the surface of the cover sheet and the image-yielding stratum and pressing the surfaces together. The laminated element may be exposed to actinic radiation, reflectographically to a reflective surface bearing a light absorbing message, or through a photographic process transparency, e.g., a photographic positive, negative, halftone or a light-transmitting paper, and, after the exposure the protective cover sheet is removed. The exposed image yielding stratum is then brought into intimate contact with the surface of an image-receptive support, e.g., paper, metal, synthetic polymer, silk screen, etc. The photopolymerizable composition is transferred to the receptor surface by applying high shear or high pressure, e.g., 500–10,000 p.s.i. to the stratum causing the inorganic thixotropic binder in the underexposed area to liquefy and transfer to the receptor to give a single copy of uniform density of the original image while in the exposed areas, no liquefaction occurs and no image transfer follows. Only a single copy is produced since there is a complete transfer of uniform density of the underexposed areas, an essential element in color proofing.

A very small amount of image transfer will occur when the matrix and receptor paper are in intimate contact by lightly drawing the point of a pointed instrument across the surface of the image receptor paper. However, experiments show that at least 1,000 p.s.i. is needed before a complete transfer of light density will occur. Optimum results are obtained by using pressures in the range of 4,000 p.s.i. to 7,000 p.s.i. Pressures above 10,000 p.s.i. do not add anything in the way of perfecting the transferred image, and pressures approximating 15,000 p.s.i. could be destructive to the materials used with distortion of the transferred image occurring.

Suitable flexible supports, which preferably transmit actinic radiation include films composed of cellulose esters, e.g., cellulose acetate, cellulose acetate butyrate; polyesters, e.g., polyethylene terephthalate; polystyrene; polyethylene and polystyrene.

The invention will be further illustrated by, but is not intended to be limited to, the following detailed examples.

EXAMPLE I

A mixture was prepared as follows:

| | Grams |
|---|---|
| Polyoxyethylated trimethylol propane triacrylate | 4.0 |
| 2-ethylanthraquinone | 0.3 |
| Boehmite alumina, AlO(OH) | 0.78 |
| Pigment Black 1, (C.I. 50440) | 1.2 |
| Water | 4.0 |
| Ethanol | 40.0 |

The polyoxyethylated trimethylol propane triacrylate is a triacrylate ester of the reaction production of trimethylol propane and ethylene oxide as prepared in Example I, assignee's Cohen et al., Ser. No. 370,338, filed May 26, 1964, U.S. Pat. 3,380,831, Apr. 30, 1968.

Boehmite alumina is fully described in U.S. Pats. 2,915,-475; 3,013,902; and 3,013,903. In general, boehmite alumina is a porous fibrous crystal material having a length to diameter ratio of 20 to 1, a pore diameter of 47 angstroms, a pore volume of 0.35 cc./g., a surface area of 275 square meters/g. and has a positive charge in solution.

The components were placed in a ball mill containing a 40% ball charge of ½" diameter porcelain balls and milled for a period of 24 hours. The resulting mixture was coated to a 0.002-inch wet depth on a 0.001-inch polypropylene film support and dried at room temperature for 1 hour while the solvent evaporated leaving a relatively dry layer but one which would smudge under thumb pressure. A cover sheet of 0.001-inch polyethylene terephthalate was placed on the coating in such a manner as to exclude any air bubbles in the coating. The laminated coating was exposed through the base of a wrong-reading positive line and text image to a Nu Arc Plate Maker, Model FT26M–2, carbon arc source as manufactured by Nu Arc, Inc., Chicago, Ill. Exposure was for 1 minute at a distance of 18 inches from the arc source. The cover sheet was removed and the photopolymerizable layer was placed face down on photolithographic paper. The combination of the matrix and receptor paper was then placed, matrix side up. in the commercially available DuPont Cronapresss® Clarifier 1. The Du Pont Cronapress® Clarifier 1 as disclosed in Halpern, U.S.P. 3,243,843 has a chamber containing a mass of pellets which is placed over the matrix. The matrix is subjected to the bombardment of the pellets by vibrating the pellets. In this manner, an impact force of 4000 p.s.i. was applied to the matrix. These impact forces can be applied in a vertical direction and/or at various angles from the vertical, systematically or at random, until the entire surface of the matrix has been subjected to an overlapping series of impact pressures. The chamber contained 5 pounds of ¼-inch diameter steel pellets and 25 pounds of 3/16-inch diameter lead pellets. Vibrating of the balls lasted for 5 minutes causing the underexposed areas to liquefy and transfer an image to the receptor paper. In the completely exposed, polymerized areas, no liquefaction or transfer of material occurred. The transferred images were well-defined and of good quality.

EXAMPLE II

Example I was repeated except that the polyethylene terephthalate cover sheet was replaced by (a) a 0.001-inch thick polyethylene sheet and (b) a 0.001-inch thick polystyrene sheet. Both cover sheets produced results similar to those of Example I.

EXAMPLE III

The following mixture was prepared:

| | Grams |
|---|---|
| Polyoxyethylated trimethylol propane triacrylate | 4.0 |
| 2-ethylanthraquinone | 0.1 |
| $SiO_2$ gel | 1.4 |
| C.I. Pigment Yellow 12 (C.I. 21080) | 0.6 |
| 10% Saponin-water-ethanol mixture | 1.0 |
| Water | 38.0 |

The polyoxyethylated trimethylol propane triacrylate was prepared as described in Example I hereof and in Example I of the prior application referred to in said example.

The thixotropic silica gel was a negatively charged composition containing 99.5% $SiO_2$ and 0.5% of metallic oxides, i.e., $Fe_2O_3$ etc., and had a surface area of 300 square meters/gram. The 10% saponin-water-ethanol mixture was used to insure a uniform coating on the polypropylene base. The mixture acts as a wetting agent for the base-photopolymer interface when a water dispersion is being coated on the base. The photopolymerizable composition was milled, coated and covered as in Example I. A 30-second exposure was allowed as in Example I and the protective cover removed. The image was transferred as in Example I was high shear being applied for 5 minutes. A well defined yellow image was transferred to the receptor.

EXAMPLE IV

The thixotropic photopolymerizable composition was prepared as follows:

| | Grams |
|---|---|
| Polyethylene glycol diacrylate | 4.0 |
| 2-ethylanthraquinone | 0.1 |
| Bentonite | 1.4 |
| C.I. Pigment Red 81, (C.I. 45160) | 0.6 |
| Water | 3.3 |
| Ethanol | 40.0 |

Polyethylene glycol diacrylate was derived from polyethylene glycol having an average molecular weight of 300. The thixotropic bentonite clay had a negative charge and was composed of the mineral montmorillonite. The photopolymerizable composition as milled, coated, covered and exposed as in Example III. The photopolymerized composition was placed in contact with receptor paper after the cover sheet was removed and 4000 p.s.i. shear pressure applied as in Example I for 5 minutes leaving on the receptor a red copy of the image corresponding to the original image.

EXAMPLE V

A mixture of the following was prepared:

| | Grams |
|---|---|
| Polyoxyethylated trimethylol propane triacrylate | 4.0 |
| 2-ethylanthraquinone | 0.1 |
| Boehmite alumina, AlO(OH) | 0.4 |
| Bentonite | 1.3 |
| $SiO_2$ gel | 0.2 |
| C.I. Pigment Red 81, (C.I. 45160) | 0.6 |
| 10% Saponin-water-ethanol mixture | 1.0 |
| Water | 38.0 |

The polyoxyethylated trimethylol propane triacrylate was prepared as described in Example I hereof and in Example I of the prior application referred to in said Example.

The three thixotropic binders used in this example are the same as those previously defined with the exception that the $SiO_2$ gel had a surface area of 260 square meters/gram and was positively charged. The ingredients were all mixed, milled, coated and covered as in Example I. The photopolymerizable layer was exposed to a carbon arc for 30 sec. as in Example I, the cover sheet removed and the image transferred as in Example III. The combination of the boehmite alumina, bentonite, and silica gel produced a highly thixotropic mixture which exhibited good pigment dispersant properties and produced fine images.

EXAMPLE VI

The same mixture of ingredients was prepared as in Example I. In addition, 1.2 grams of photocrosslinkable polymeric compound of methyl methacrylate, acrylonitrile, and glycidyl methacrylate as prepared in assignee's Schoenthaler patent application. Ser. No. 451,300, filed Apr. 27, 1965, U.S. Pat. 3,418,295, Dec. 24, 1968, was added to the mixture prior to ball milling. After milling, coating, and covering, the photopolymerizable composition was exposed as in Example I. The image transfer was produced as in Example I with improved image transfer characteristics. The transfer of the image was complete after 4 minutes of 4000 p.s.i. pressure application rather than the 5-minute procedure required in Example I.

EXAMPLE VII

The mixture of Example III was prepared except that 0.1 g. of the lauryl sodium salts of polymerized alkyl napthaline sulfonicacid [1] having a density of 37.4–42.5 pounds/cubic foot and a surface tension of 70–71 dynes/cm. was added to the mixture prior to ball milling. The same procedure of milling through image transfer was followed as in Example III with the result that image transfer was effected in 3 minutes rather than the 5 minutes required in Example III. A well defined image corresponding to the original was produced on the receptor paper.

EXAMPLE VIII

The thixotropic photopolymerizable composition was prepared and coated as in Example I. A 0.001-inch polyethylene terephthalate cover sheet was laminated to the photopolymerizable layer but prior to exposure it was removed. Since the photopolymerizable layer was quite dry and nontacky, the cover sheet was replaced with the negative image transparency and exposure made through the negative as in Example I. The image was transferred as in Example I leaving a well defined image on the receptor paper.

EXAMPLE IX

A mixture of the following was prepared.

| | Grams |
|---|---|
| Polyoxyethylated trimethylol propane triacrylate | 160 |
| 2-ethylanthraquinone | 9.2 |
| Boehmite alumina, AlO(OH) | 25.2 |
| Pigment Black 1, (C.I. 50440) | 48.0 |
| Photocrosslinkable polymeric compound | 45.0 |
| Dimethyl silicone | 0.2 |
| Water | 114.0 |
| Ethanol | 400.0 |

The polyoxyethylated trimethylol propane triacrylate was prepared as in Example I. The photocrosslinkable polymeric compound was the same as that of Example VI. The dimethyl silicone, a surface releasing aid, was an organosiloxane fluid having a surface tension of 21.0 dynes/cm. and a viscosity of 50 centistokes. The entire mixture was ball milled overnight, coated and covered as in Example I. Exposure was for one minute as in Example I. Image transfer was achieved by the use of pressure rolls.

The pressure rolls were calender rolls manufactured by Adamson United Company, Akron, Ohio. The rolls were 8 inches in diameter and 16 inches long with a pressure capacity range of 5,000 p.s.i. to 20,000 p.s.i. The martix and receptor paper were placed in intimate contact with each other, after exposure, and removal of the cover sheet. The combined matrix and receptor paper were sandwiched between two pieces of light cardboard to protect the matrix, keep the rolls clean, and insure a uniform pressure distribution. The calender rolls were operating at 10,000 p.s.i. pressure and the matrix and receptor paper were fed through the rolls at a rate of 2 ft./min. The underexposed areas liquefied under this high pressure and an image corresponding to the underexposed area was transferred to the receptor paper. Perfect transfers were obtained.

[1] Commercially available as Daxad 11® W. R. Grace Co.

EXAMPLE X

The thixotropic photopolymerizable composition was prepared, coated, covered, and exposed as in Example I. Image transfer was obtained by the use of the Du Pont Cronapress® Clarifier 2, disclosed in assignee's U.S. Pats. 3,128,497 and 3,128,498, both by Alles. The cover sheet was removed from the exposed photopolymerized composition and replaced with a piece of photolithographic receptor paper. The combined matrix and receptor paper were placed matrix side up in the Du Pont Cronapress® Clarifier 2. The pressure fingers of the machine exerted a pressure of approximately 4,000 p.s.i. on the matrix causing the underexposed areas to liquefy and transfer a corresponding image to the receptor paper. Image transfer was complete in 7 minutes.

EXAMPLE XI

A mixture of the following was prepared:

| | Grams |
|---|---|
| Polyoxyethylated trimethylol propane triacrylate | 48.0 |
| 2-Ethylanthraquinone | 4.5 |
| Boehmite alumina, AlO(OH) | 9.34 |
| Pigment Black 1, (C.I. 50440) | 19.0 |
| Water | 44.0 |
| Ethanol | 475.0 |

The polyoxyethylated trimethylol propane triacrylate was prepared as in Example I. The ingredients were ball milled for a period of 48 hours. The mixture was coated to a 0.002-inch depth on a 0.0008-inch thick polypropylene base, dried for one hour at room temperature and covered with a 0.002-inch polyethylene cover sheet. The photopolymerizable composition was exposed as in Example I. Image transfer was accomplished through the use of a Model 341–20 hydraulic platen press, manufactured by Loomis Engineering and Manufacturing Co., Caldwell, N.J., and having a 40,000 p.s.i. pressure capacity. The protective cover sheet was removed from the exposed photopolymerized composition and a sheet of white bond paper placed over the exposed area. The paper and the matrix were than placed between two hard rubber pads and placed on the piston end of the hydraulic press. The jaws of the press were closed and pressure applied by the hydraulic piston. A pressure of 5000 p.s.i. was applied. The pressure was released and the matrix and receptor paper separated. A complete image transfer was obtained corresponding to the underexposed areas of the photopolymerized composition. The amount of time required for image transfer was not a dependent variable as it was in Examples I–X. The quality of the transferred image improves with the amount of static pressure applied, reaching a maximum quality print at a pressure of approximately 5000 p.s.i. Higher pressures result in distorted images and damaged receptor paper.

Lamination of the cover sheet to the photopolymerizable stratum usually is carried out immediately after the coating and drying but it may also be effected immediately prior to exposure or anytime therebetween. Preferably, the cover sheet and photopolymerizable stratum are flexible, as lamination is then effected most easily. Lamination in such a case can be effected by passing the elements between pairs of rollers. Satisfactory results are obtained when either the cover sheet or the support are of nonflexible material. With a nonflexible element, some means other than the pairs of rollers must be used to laminate the cover sheet, i.e., a single hand-operated roller. Laminating pressure should be sufficient to bring about good contact between the surfaces but not sufficient to damage the photopolymerizable stratum.

The photopolymerizable layer, protected by the cover sheet is exposed to actinic radiation. Exposure may be through a two-tone image or a process transparency, e.g., a process negative or positive. The image or transparency may or may not be in operative contact with the protective cover sheet, i.e., the exposure may be by contact through paper or other light transmitting materials but a stronger radiation source or longer exposure times must be used.

After exposure, the cover sheet is removed and the exposed composition with its completely exposed, polymerized areas and its underexposed, unpolymerized areas is brought into intimate contact with a receptive support at room temperature. High shear or high pressure is then applied for a period of 3 to 6 minutes depending upon whether transfer improvement additives are used. In the underexposed areas, liquefaction due to the high shear occurs and image transfer takes place while in the overexposed areas, no liquefaction occurs and no transfer to the receptor takes place. Pressure can be applied by rollers, flat or curved surfaces, bouncing balls on the photopolymerizable support or receptor support, or platens, etc., as well as by the specific methods of the examples. Suitable image receptive supports include paper including bond paper, resin and clay sized paper, resin coated or impregnated paper; cardboard; metal sheets and foils, e.g., aluminum, copper, steel, bronze, etc.; wood; glass; nylon; rubber; polyethylene; linear condensation polymers such as polyesters, e.g., polyethylene terephthalate, regenerated cellulose, and cellulose esters; e.g. cellulose acetate; silk; cotton and viscose rayon fabrics or screens.

The receptive support may have a hydrophilic surface or may contain on its surface chemical compounds which react with compounds being transferred so as to produce differences in color, hydrophilicity or conductivity between the exposed and underexposed areas, or for improved adhesion or brightening of the receptive support. The image receptor surface may be smooth, contain roughening agents such as silica, be perforated, or be in the form of a mesh or screen.

As noted before, a removable cover sheet is placed in intimate contact with the photopolymerizable stratum, at least during exposure. The cover sheet must be capable of uniformly transmitting actinic radiation and having a high retardation of oxygen in order to maintain a photopolymerizable element having a maximum degree of sensitivity to the radiation. If placed over the stratum immediately after coating and drying of the unexposed polymerization composition, the cover sheet serves a further purpose of preventing damage to the coating prior to exposure and insures a higher resolution when image transfer occurs. A polyethylene sheet is a suitable removable sheet or support. Other suitable materials are transparent film such as regenerated cellulose, cellulose esters, e.g., cellulose acetate, cellulose propionate, etc.; other polyesters, e.g., polypropylene terephthalate, polyethylene terephthalate, polyethylene terephthalateisophthalate copolymer, polycarbonate, etc.; polyethylene; polypropylene; polyvinylidene chloride; polyacrylonitrile; polyvinyl alcohol, etc.; certain coated transparencies or translucent papers, e.g., waxed paper, etc. The cover sheet may be used to add additional information to the image that is to be transformed, e.g., graphs and other detail. The cover sheet may also be colored but must be capable of transmitting radiation of the wave length to which the photopolymerizable element is sensitive.

Exposure of the image in the above described invention can be made through a stencil, line or halftone negative or positive (an image bearing transparency consisting solely of substantially opaque and substantially transparent areas where the opaque areas are substantially of the same optical density, the so-called line or halftone negative or positive), or other suitable transparency and can be either by contact or projection exposure. Whether a positive or negative copy is produced depends upon the type of image source used and method of exposure. If made by contact with a negative or positive, the negative or positive can serve as the cover sheet during exposure. Exposure to actinic radiation is given until substantial polymerization takes place in the exposed areas to form an addition polymer and significantly less polymerization takes place in the underexposed areas. Alternatively, reflectographic exposure techniques may be employed. Such techniques are described in U.S. Pats.: Burg et al. 3,060,023, and Heiart 3,203,801.

In practicing a preferred embodiment of the invention, exposure is usually by a carbon arc source, but many other sources are suitable.

Since free-radical generating addition-polymerization initiators activatable by actinic radiation generally exhibit their maximum sensitivity in the ultraviolet range, the radiation source usually furnishes an effective amount of this radiation. Such sources include carbon arcs, mercury-vapor arcs, fluorescent lamps with ultraviolet radiation-emitting phosphors, argon glow lamps, electronic flash units and photographic flood lamps. Of these, the carbon arcs are customarily used at a distance within the range of 2 to 60 inches from the photopolymerizable layer. It is noted, however, that in certain circumstances it may be advantageous to expose with visible light, using a photoinitiator sensitive in the visible region of the spectrum, e.g., 9,10-phenanthrenequinone. In such cases, the radiation source should furnish an effective amount of visible radiation. Many of the radiation sources listed above furnish the required amount of visible light.

As indicated above, inorganic thixotropic binders are used to give the composition its image transfer characteristics. It is known that the incorporation of fillers in the photopolymerizable composition will reduce the flow of the mixture because of increased viscosity thus making it easier to prepare a coated photopolymerizable composition. Heiart U.S. Pats. 3,060,026 and 3,202,508 discloses the use of thickening agents for increasing viscosity, improving the strength of the composition and reducing tack, the latter property being present due to the use of thermoplastic polymers to create a temperature relationship required to insure transferability of the image. However, the thixotropic binder here employed with the monomer is essential to insure imagewise transfer, independent of any temperature relationship since after exposure, the thixotropic binder in the underexposed areas will liquefy under high shear or high pressure causing an imagewise transfer of the underexposed areas while no liquefaction occurs in the overexposed areas. Suitable binders for this photopolymerizable composition include the inorganic thixotropic materials. Preferably the binder is a colloidal thixotropic metallic oxide which carries a surface charge and ranges in size from 5 to 500 millimicrons. Examples of these materials include the following:

(a) Boehmite alumina, AlO(OH), a highly porous aggregated mass of fibrous crystals having a length to diameter ratio of 20 to 1.

(b) Clay mixtures of highly thixotropic silicate oxides, e.g., bentonites (c) Finely divided thixotropic gels containing 99.5% $SiO_2$ with 0.5% of mixed metallic oxides and having a surface area of 250–350 square meters/gram.

The thixotropic binders may be combined to aid in pigment dispersing. It is generally believed that the thixotropic members contain a charge which is opposite of that of the pigment, thus producing good dispersing of the pigment. However, this theory is in no way intended to limit the scope of this invention.

While the addition polymerization component present in the photopolymerizable element can be any monomeric ethylenically unsaturated compound capable of polymerizing or forming a high polymer in a short time by photoinitiated addition polymerization as disclosed in Plambeck, U.S. 2,760,863. The particularly useful compounds fall within a general class, namely, normally non-gaseous (i.e., at 20° C. and atmospheric pressure) ethylenically unsaturated monomeric compounds having one to four terminal ethylenic groups.

Suitable free-radical initiated, chain-propagating, addition polymerizable, ethylenically unsaturated, compounds such as those disclosed in U.S. Pats. 2,927,022; ,2,929,710; 3,043,805; and 3,202,508 may be satisfactorily used within the scope of this invention.

Free-radical generating, addition polymerization initiators activatable by actinic light and thermally inactive at and below 85° C. such as those disclosed in Plambeck, U.S. Pat. 2,760,863 and Heiart, U.S. Pat. 3,202,508 may be used as initiators for the photopolymerizable structure of this invention.

Suitable thermal polymerization inhibitors that can be used in photopolymerizable compositions include p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl p-cresol, phenothiazine, pyridine, nitrobenzene and dinitrobenzene. Other useful inhibitors include p-toluquinone and chloranil.

To the photopolymerizable composition, there may be added certain organic and inorganic compounds to improve the properties of the coated photopolymerizable composition, e.g., adhesion to the base support, image transfer properties, adhesion to the receptor paper, etc. Wetting agents may be added to permit a uniform and proper coating of a water dispersion on a hydrophobic base, providing improved adhesion of the photopolymerizable composition to the base, e.g., mixtures of saponin, water, and alcohol; sodium salts of polymerized alkyl naphthalene sulfonic acid, etc. Imagewise transfer and adhesion to the receptor surfaces are aided by the use of organic fillers, e.g., organophilic silica, crosslinked polymers of controlled molecular length, such as those disclosed in assignee's Schoenthaler Ser. No. 451,300, now pending before the United States Patent Office, etc. Various surface releasing aids may also be added to the photopolymerizable composition. These aids are usually nonpolar, low surface tension compounds, e.g., dimethyl silicone.

Various dyes and color forming components can be added to the photopolymerizable compositions to give varied results after the transfer step. These additive materials, however, preferably should not absorb excessive amounts of radiation at the exposure wave length or inhibit the polymerization reaction. The more suitable dyes and color forming components are disclosed in U.S. Pat. 3,202,508.

Various pigments may also be added to the photo polymerizable composition to add color to the image. The inorganic pigments, clays, oxides of metal or synthetic organic materials should be insoluble or practically so in the medium in which they are dispersed. The pure organic compounds are known as toners while the diluted organic pigments prepared by absorbing a dye on a metallic hydroxide are known as lakes. Suitable toners include the organic azo compounds and organic azine compounds while suitable lakes can be obtained by use of the rhodamine pigments. The preferred pigments used in this invention are Pigment Black 1, (C.I. 50440), Pigment Yellow 12, (C.I. 21090), Pigment Red 81, (C.I. 45160). Various pigment dispersant aids may also be added, e.g., carboxyvinyl polymers as well as some of the organic binders previously mentioned.

The abbreviation C.I. refers to the Colour Index 2nd Edition, The Society of Dyes and Colourists, Dean House, Picadilly, Bradford, Yorkshire, England, 1956 and the American Association of Textile Chemists and Colourists, Lowell Technological Institute, Lowell, Mass., U.S.A.

After ball-milling, the photopolymerizable composition is preferably coated on a support and allowed to dry. Satisfactory supports are glass, paper, (including waxed or transparentized paper), cellulose esters, e.g., cellulose acetate, cellulose propionate, cellulose butyrate etc., other plastic compositions such as polyamides, polyesters, etc., and any other materials as disclosed in Plambeck, U.S. Pat. 2,760,863. The support may contain either on its surface or in the support itself, an antihalation layer beneath the photopolymerizable stratum as disclosed in U.S. Pat. 2,760,863 needed to facilitate anchorage to the base.

The photopolymerizable thixotropic compounds of the present invention are useful for a variety of copying, printing, decorative, and manufacturing applications. Using a photopolymerizable thixotropic composition as described herein, an image, after exposure may be transferred to a receptor surface in contact with the exposed photopolymerized composition, by the application of high shear or high pressure directly or indirectly to either the photopolymerizable composition support or to the receptor surface. The compounds described herein are very useful for making multicolor reproductions.

An advantage of this invention is that the compounds are simple and dependable. Other advantages result from placing a removable cover sheet on the photopolymerizable stratum during the exposure step. By using the cover sheet, the oxygen concentration in contact with the material is substantially reduced resulting in increased sensitivity and speed to the actinic radiation. Furthermore, since the photopolymerizable composition is dry, it is possible to use a process negative or positive as the cover sheet eliminating the need of a specially laminated cover sheet during exposure.

Advantages inherent in a room temperature process make the use of this photopolymerizable thixotropic composition preferred over thermal processes. Like thermal processes, a means of readout of photopolymer images is provided but unlike thermal transfer processes, the transfer can be made at room temperature eliminating thermal distortion. Also, no thermoplastic polymer is required as in all thermal and temperature processes.

Desirable advantages exist as the result of using a dry photopolymerizable composition. Less volatilization of toxic monomer results from the use of a dry photopolymerizable composition. Inking and plate wetting are eliminated with images originating from dry thixotropic coatings. This results in the use of less expensive equipment as well as the use of a greater variety of receptor surfaces.

Several advantages are derived from the use of a photopolymerizable thixotropic composition. Combining the photopolymerizable components and the thixotropic binders yields the advantage that upon the application of high shear or high pressure, liquefaction and image transfer occurs only in the underexposed areas while no liquefaction or transfer occurs in the exposed areas. Imagewise transfer when induced by pressural techniques provide a uniform density of the transferred image. This advantage produces superior overprinting characteristics, essential to color proofing and multiple color transfers. The use of a thixotropic photopolymerizable composition as disclosed herein results in a dry, pressure sensitive transfer process.

The embodiments of the invention in which an exclusive property or privilege is claimed are defined as follows:

1. An image-forming element for pressure transfer which comprises a support having coated thereon a photopolymerizable stratum consisting essentially of a uniform admixture of (a) an inorganic thixotropic gel binder, and (b) a nongaseous ethylenically unsaturated compound containing at least one terminal ethylenic group and being capable of forming a high polymer by free radical initiated chain propagating, addition polymerization, constituents (a) and (b) being present in an amount from 0.2 to 12 and 1 to 30 parts by weight, respectively, the admixture containing (c) a free radical generating addition polymerization initiator activatable by actinic light and thermally inactive at and below 85° C. in an amount from 0.02 to 2 parts by weight, the average particle size of the constituents in the admixture being in the range 5 to 500 millimicrons, said thixotropic gel binder being capable of liquifying and transferring to a receptor surface upon application of pressure of at least 1000 pounds per square inch at room temperature.

2. An element according to claim 1, wherein the admixture also containing (d) a thermal addition polymerization inhibitor.

3. An element according to claim 1 also containing (e) up to 5% by weight based on constituent (a), and as a diluent, a thermoplastic organic polymer.

4. An element according to claim 1, wherein the support is a thin flexible sheet.

5. An element according to claim 1, wherein the support is a transparent macromolecular polymer film.

6. An element according to claim 1, wherein the stratum is solid at normal atmospheric pressure and at 100° C.

7. An element according to claim 1, wherein the stratum contains a finely divided pigment.

8. An element according to claim 1, wherein the unsaturated compound is a polyoxyethylated trimethylolpropane triacrylate and boehmite alumina is present in binder (a).

9. An element according to claim 1, wherein the unsaturated compound is polyethylene glycol diacrylate and bentonite is present in binder (a).

10. A process which comprises (1) exposing to actinic radiation selected areas of a photopolymeriazle stratum of a photopolymerizable element having a support bearing said stratum, the stratum consisting essentially of a uniform admixture of (a) an inorganic thixotropic gel binder, and (b) a non-gaseous ethylenically unsaturated compound containing at least one terminal ethylenic group and being capable of forming a high polymer by free radical initiated chain propagating, addition polymerization, constituents (a) and (b) being present in an amount from 0.2 to 12 and 1 to 30 parts by weight, respectively, the admixture containing (c) a free radical generating addition polymerization initiator activatable by actinic light and thermally inactive at and below 85° C. in an amount from 0.02 to 2 parts by weight, the average particle size of the constituents in the admixture being in the range 5 to 500 millimicrons, to produce a polymerized image in the exposed areas without causing polymerization in under-exposed areas, and (2) bringing the exposed image-containing stratum into surface contact with the surface of an image-receptive support, and (3) applying pressure of at least 1000 pounds per square inch at room temperature to the assembled elements to cause the thixotropic gel binder in the under-exposed areas of the stratum to liquefy and transfer to the surface of the receptor sheet, and (4) separating the element from the receptor sheet.

11. A process according to claim 10, wherein steps (2) and (3) are effected simultaneously.

12. A process according to claim 10, wherein steps (2) and (3) are effected separately in the order given.

13. A process according to claim 10, wherein the shear stress or pressure is at least 1,000 p.s.i.

14. A process according to claim 10, wherein the pressure is applied by simultaneous application of a large number of overlapping impact forces of small area.

15. A process according to claim 10, wherein the pressure is applied by a vibrating mass of pellets.

References Cited

UNITED STATES PATENTS

| | | | |
|---|---|---|---|
| 2,631,137 | 3/1953 | Loritsch. | |
| 2,641,587 | 6/1953 | Nordlaner | 260—40 |
| 2,728,740 | 12/1955 | Iler. | |

NORMAN G. TORCHIN, Primary Examiner

J. E. CALLAGHAN, Assistant Examiner

U.S. Cl. X.R.

96—115